(12) United States Patent
Lin et al.

(10) Patent No.: US 11,915,984 B2
(45) Date of Patent: Feb. 27, 2024

(54) FORMING A WRAP-AROUND CONTACT TO CONNECT A SOURCE OR DRAIN EPITAXIAL GROWTH OF A COMPLIMENTARY FIELD EFFECT TRANSISTOR (CFET) TO A BURIED POWER RAIL (BPR) OF THE CFET

(71) Applicant: Synopsys, Inc., Mountain View, CA (US)

(72) Inventors: Xi-Wei Lin, Fremont, CA (US); Victor Moroz, Saratoga, CA (US)

(73) Assignee: Synopsys, Inc.

( * ) Notice: Subject to any disclaimer, the term of this patent is extended or adjusted under 35 U.S.C. 154(b) by 73 days.

(21) Appl. No.: 17/372,249

(22) Filed: Jul. 9, 2021

(65) Prior Publication Data
US 2023/0163032 A1    May 25, 2023

Related U.S. Application Data

(60) Provisional application No. 63/053,501, filed on Jul. 17, 2020.

(51) Int. Cl.
*H01L 21/8238* (2006.01)
*H01L 21/822* (2006.01)
(Continued)

(52) U.S. Cl.
CPC .. *H01L 21/823814* (2013.01); *H01L 21/8221* (2013.01); *H01L 21/823807* (2013.01);
(Continued)

(58) Field of Classification Search
CPC ..... H01L 21/823814; H01L 21/823807; H01L 21/823871; H01L 21/823475;
(Continued)

(56) References Cited

U.S. PATENT DOCUMENTS 9,397,049 B1    7/2016 Fan et al.
9,653,575 B1    5/2017 Basker et al.
(Continued)

FOREIGN PATENT DOCUMENTS

EP    3675158 A2    7/2020
TW    201635493 A    10/2016
(Continued)

OTHER PUBLICATIONS

Ryckaert, J et al, "The Complementary FET (CFET) for CMOS scaling beyond N3", 2018 IEEE Symposium on VLSI Technology, IEEE, Jun. 18, 2018, pp. 141-142.

*Primary Examiner* — Michael M Trinh
(74) *Attorney, Agent, or Firm* — Haynes Beffel & Wolfeld LLP; Andrew L. Dunlap

(57) ABSTRACT

A method of forming an electrical connection between a buried power rail (BPR) of an unfinished complementary field effect transistor (CFET) and a source or drain epitaxial growth of a lower level of the CFET is provided. The method includes performing silicon epitaxial growth in a lower level of the CFET, adding a contact material to a portion of an exposed portion of the silicon epitaxial growth in the lower level, the exposed portion of the silicon epitaxial growth being located in a vertical slot of the unfinished CFET structure, adding a conductive material within a vertical channel, the conductive material being in contact with the added contact material and the BPR to form an electrical connection between the portion of the exposed portion of the silicon epitaxial growth and the BPR and etching back a portion of the added conductive material within the vertical channel.

19 Claims, 7 Drawing Sheets

(51) Int. Cl.
*H01L 27/06* (2006.01)
*H01L 27/092* (2006.01)

(52) U.S. Cl.
CPC ............ *H01L 21/823871* (2013.01); *H01L 21/823885* (2013.01); *H01L 27/0688* (2013.01); *H01L 27/092* (2013.01)

(58) Field of Classification Search
CPC ............ H01L 21/8221; H01L 27/0688; H01L 27/088; H01L 27/092; H01L 29/0847; H01L 29/43292; H01L 29/0673; H01L 29/775
See application file for complete search history.

(56) References Cited

U.S. PATENT DOCUMENTS

| | | | |
|---|---|---|---|
| 10,177,227 B1 | 1/2019 | Yoshida et al. | |
| 10,236,217 B1 | 3/2019 | Ando et al. | |
| 10,236,292 B1* | 3/2019 | Frougier | H01L 21/823864 |
| 10,256,158 B1 | 4/2019 | Frougier et al. | |
| 10,269,929 B2 | 4/2019 | Wostyn et al. | |
| 10,388,519 B2* | 8/2019 | Smith | H01L 29/42392 |
| 10,546,925 B2 | 1/2020 | Reznicek et al. | |
| 10,833,003 B1* | 11/2020 | Chou | H01L 23/50 |
| 11,227,922 B2* | 1/2022 | Li | H01L 29/66742 |
| 2009/0014806 A1 | 1/2009 | Ostermayr et al. | |
| 2009/0081815 A1 | 3/2009 | Yamashita et al. | |
| 2010/0237406 A1 | 9/2010 | Oyu | |
| 2011/0003256 A1 | 1/2011 | Van Der Heijden et al. | |
| 2015/0333131 A1 | 11/2015 | Mojumder et al. | |
| 2016/0247722 A1 | 8/2016 | Zhang et al. | |
| 2018/0026042 A1 | 1/2018 | Smith et al. | |
| 2018/0374791 A1 | 12/2018 | Smith et al. | |
| 2019/0051523 A1 | 2/2019 | Huang et al. | |
| 2019/0057867 A1* | 2/2019 | Smith | H01L 29/0669 |
| 2019/0109136 A1 | 4/2019 | Ching et al. | |
| 2019/0131184 A1 | 5/2019 | Ando et al. | |
| 2019/0172755 A1 | 6/2019 | Smith et al. | |
| 2019/0288004 A1 | 9/2019 | Smith et al. | |
| 2020/0035569 A1 | 1/2020 | Frougier et al. | |
| 2020/0105671 A1 | 4/2020 | Lai et al. | |
| 2020/0111670 A1 | 4/2020 | Huang et al. | |
| 2021/0098294 A1* | 4/2021 | Smith | H01L 21/76802 |
| 2021/0098306 A1* | 4/2021 | Smith | H01L 27/092 |
| 2021/0202500 A1* | 7/2021 | Chanemougame | H01L 29/78696 |
| 2021/0366907 A1 | 11/2021 | Liao et al. | |
| 2022/0020647 A1 | 1/2022 | Lin et al. | |
| 2022/0037497 A1 | 2/2022 | Chung et al. | |
| 2022/0157936 A1 | 5/2022 | Khaderbad et al. | |
| 2022/0165730 A1 | 5/2022 | Chen et al. | |

FOREIGN PATENT DOCUMENTS

| | | |
|---|---|---|
| TW | 201913821 A | 4/2019 |
| TW | 201917893 A | 5/2019 |
| TW | 201937611 A | 9/2019 |
| TW | 201939747 A | 10/2019 |
| TW | 202018825 A | 5/2020 |
| TW | 202025448 A | 7/2020 |
| WO | 2020065916 A1 | 4/2020 |
| WO | 2020137660 A1 | 7/2020 |

* cited by examiner

FORMING A WRAP-AROUND CONTACT TO CONNECT A SOURCE OR DRAIN EPITAXIAL GROWTH OF A COMPLIMENTARY FIELD EFFECT TRANSISTOR (CFET) TO A BURIED POWER RAIL (BPR) OF THE CFET

RELATED APPLICATION

This application claims priority under 35 U.S.C. § 119(e) to U.S. Provisional Application No. 63/053,501, entitled "FORMING A WRAP-AROUND CONTACT TO CONNECT A SOURCE/DRAIN (S/D) EPITAXY OF A COMPLEMENTARY FIELD EFFECT TRANSISTOR (CFET) TO A BURIED POWER RAIL (BPR) OF THE CFET", filed on Jul. 17, 2020.

TECHNICAL FIELD

The present disclosure relates to manufacturing an electrical contact between a buried power rail (BPR) of an unfinished complementary field effect transistor (CFET) and a source or drain epitaxial growth of a lower level the unfinished CFET. In particular, the present disclosure relates to a forming reliable metal contact by partially wrapping conductive material, such as metal, around the source or drain epitaxial growth of the CFET, where the conductive material provides an electrical connection between the BPR of the CFET.

BACKGROUND

Transistor stacking, such as the stacking implemented in a complementary field effect transistor (CFET), is a candidate for transistor density scaling and sustainment of Moore's Law in the next 5-10 years. The concept behind CFET is to scale in 3D, by stacking one transistor on another vertically, resulting in density doubling with the same feature size. This CFET architecture requires innovative methods of manufacturing that have not been implemented when manufacturing a single transistor stack.

SUMMARY

The technology disclosed provides an electrical contact that wraps around a portion of a source and/or drain lower level epitaxy of a complementary field effect transistor (CFET) and connects to a buried power rail (BPR) of the CFET.

In an aspect of the technology disclosed, a method of forming an electrical connection between a buried power rail (BPR) of an unfinished complementary field effect transistor (CFET) and a source or drain epitaxial growth of a lower level of the unfinished CFET is provided. The method can include performing silicon epitaxial growth in a lower level of an unfinished CFET structure to form at least one of a source and a drain in the lower level of the unfinished CFET structure, adding a contact material to at least a portion of an exposed portion of the silicon epitaxial growth in the lower level, the exposed portion of the silicon epitaxial growth being located in a vertical slot of the unfinished CFET structure, adding a conductive material within a vertical channel formed in the unfinished CFET structure, the conductive material being in contact with (i) the contact material added to the portion of the exposed portion of the silicon epitaxial growth in the lower level and (ii) the BPR to form an electrical connection between the portion of the exposed portion of the silicon epitaxial growth and the BPR, and etching back a portion of the added conductive material within the vertical channel.

In another aspect of the technology disclosed, the lower level can form a positive-channel metal oxide semiconductor.

In a further aspect of the technology disclosed, the silicon epitaxial growth performed on the lower level can be SiGe epitaxial growth.

In an aspect of the technology disclosed, the silicon epitaxial growth performed on the lower level can be p+ source and drain epitaxy to form n+ SiGe.

In another aspect of the technology disclosed, the vertical slot can be located between at least two vertical dividers comprising silicon nitride.

In a further aspect of the technology disclosed, the contact material can be one of Ti and Ti silicide.

In an aspect of the technology disclosed, the method can further include, prior to the adding of the contact material to at least the portion of the exposed portion of the silicon epitaxial growth in the lower level, adding a blocking material to fill at least a portion of the vertical slot of the unfinished CFET structure, and performing a contact etch on the added blocking material to form the vertical channel that exposes the portion of the silicon epitaxial growth in the lower level that was previously covered by the blocking material.

In another aspect of the technology disclosed, before the performing of the contact etch, the blocking material can cover all exposed surfaces within the vertical slot, except for a contact surface of the silicon epitaxial growth.

In a further aspect of the technology disclosed, the blocking material can include at least one of a carbon-based material, aluminum oxide, silicon nitride-based materials, and carbon doped silicon oxide (SiCOH).

In an aspect of the technology disclosed, the conductive material can be added by filling in at least a portion of the vertical channel, such that the conductive material (i) covers the contact material, (ii) reaches the BPR and (iii) forms the electrical connection between the portion of the exposed portion of the silicon epitaxial growth and the BPR.

In a further aspect of the technology disclosed, the conductive material can include at least one of Ruthenium, Tungsten, Cobalt and Molybdenum.

In another aspect of the technology disclosed, the method can include, after the etching-back of the portion of the added conductive material, adding a blocking material within the vertical channel to cover at least a portion of the etched-back conductive material.

In an aspect of the technology disclosed, the method can further include adding a blocking material within the vertical channel to cover at least a portion of the etched-back conductive material.

In a further aspect of the technology disclosed, the method can further include performing silicon epitaxial growth in an upper level of an unfinished CFET structure.

In another aspect of the technology disclosed, the upper level can form a negative-channel metal oxide semiconductor.

In an aspect of the technology disclosed, the silicon epitaxial growth performed on the upper level can be Si epitaxial growth on Si.

In a further aspect of the technology disclosed, the silicon epitaxial growth on the upper level can be n+ S/D epitaxy to form n+ doped silicon.

In another aspect of the technology disclosed system for forming an electrical connection between a buried power rail (BPR) of an unfinished complementary field effect transistor (CFET) and a source or drain epitaxial growth of a lower level of the unfinished CFET is provided. The system can include a memory storing instructions and a processor, coupled with the memory and to execute the instructions. The instructions when executed causing the processor to perform silicon epitaxial growth in a lower level of an unfinished CFET structure to form at least one of a source and a drain in the lower level of the unfinished CFET structure, add a contact material to at least a portion of an exposed portion of the silicon epitaxial growth in the lower level, the exposed portion of the silicon epitaxial growth being located in a vertical slot of the unfinished CFET structure, add a conductive material within a vertical channel formed in the unfinished CFET structure, that the conductive material being in contact with (i) the contact material added to the portion of the exposed portion of the silicon epitaxial growth in the lower level and (ii) the BPR to form an electrical connection between the portion of the exposed portion of the silicon epitaxial growth and the BPR, and etch back a portion of the added conductive material within the vertical channel.

In an aspect of the technology disclosed, a non-transitory computer readable storage medium comprising stored instructions for forming an electrical connection between a buried power rail (BPR) of an unfinished complementary field effect transistor (CFET) and source or drain epitaxial growth of a lower level of the unfinished CFET is provided. The instructions, when executed by a processor, can cause the processor to implement operations including performing silicon epitaxial growth in a lower level of an unfinished CFET structure to form at least one of a source and a drain in the lower level of the unfinished CFET structure, adding a contact material to at least a portion of an exposed portion of the silicon epitaxial growth in the lower level, the exposed portion of the silicon epitaxial growth being located in a vertical slot of the unfinished CFET structure, adding a conductive material within a vertical channel formed in the unfinished CFET structure, the conductive material being in contact with (i) the contact material added to the portion of the exposed portion of the silicon epitaxial growth in the lower level and (ii) the BPR to form an electrical connection between the portion of the exposed portion of the silicon epitaxial growth and the BPR, and etching back a portion of the added conductive material within the vertical channel.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to forming a wrap-around contact to connect a source or drain epitaxial growth of a complimentary field effect transistor (CFET) to a buried power rail (BPR) of the CFET.

The concept behind CFET is to scale transistor structures in 3D, by stacking one transistor on another vertically, resulting in density doubling with the same feature size.

One unique aspect of CFET, in comparison to a single transistor stack, is the manufacturing sequence of forming a lower level stack and an upper level stack and interconnections between the two levels. The technology disclosed provides a process of connecting components of the CFET. Specifically, this 3D stacking used to form the CFET structure is fundamentally different from the conventional process technologies for forming a traditional field effect transistor (FET), which only includes a single level of transistors. This 3D stacking used to form the CFET structure has many new challenges arising with respect to vertical interconnection in the front-end-of-line (FEOL) of the CFET. The FEOL of the CFET can be a portion of the CFET, which during fabrication, that is patterned to form the active transistor components. One challenge to overcome is to provide a relatively low resistance contact (e.g., less than 500 Ohms) to connect the source or drain epitaxial growth of a lower level the CFET to an underlying buried power rail (BPR). The technology disclosed provides a robust process that forms a wrap-around contact on the source or drain epitaxial growth of the lower level of the CFET using a metal, which electrically connects the source or drain epitaxial growth of the lower level to the BPR of the CFET.

Aspects of the technology disclosed relate to a method of making wrap-around contacts to source and/or drain epitaxial growth of the CFET structure, as well as a system and computer instructions for making the wrap-around contacts.

Specifically, the technology disclosed corresponds to a sequence of steps and mask sizing to form wrap-around contacts between a source or a drain of epitaxial growth of a lower level of a CFET and a buried power rail (BPR) located below the lower level of the CFET. The wrap-around contact can have a relatively large contact size (i.e., 10 nm by 20 nm for 1 or 2 nm technology node) so as to provide a relatively low resistance (e.g., less than 500 Ohms) electrical connection between the BPR and the lower level source or drain epitaxy. A BPR can include metal wires located below an active part of the CFET that are for routing power and ground lines to other components. The technique implemented by the technology disclosed is robust with a wide process margin (e.g., a large tolerance during manufacturing) to achieve lower contact resistance between the lower level source or drain epitaxy and the BPR, maximizing yield and performance of CFET devices.

Figure 1:
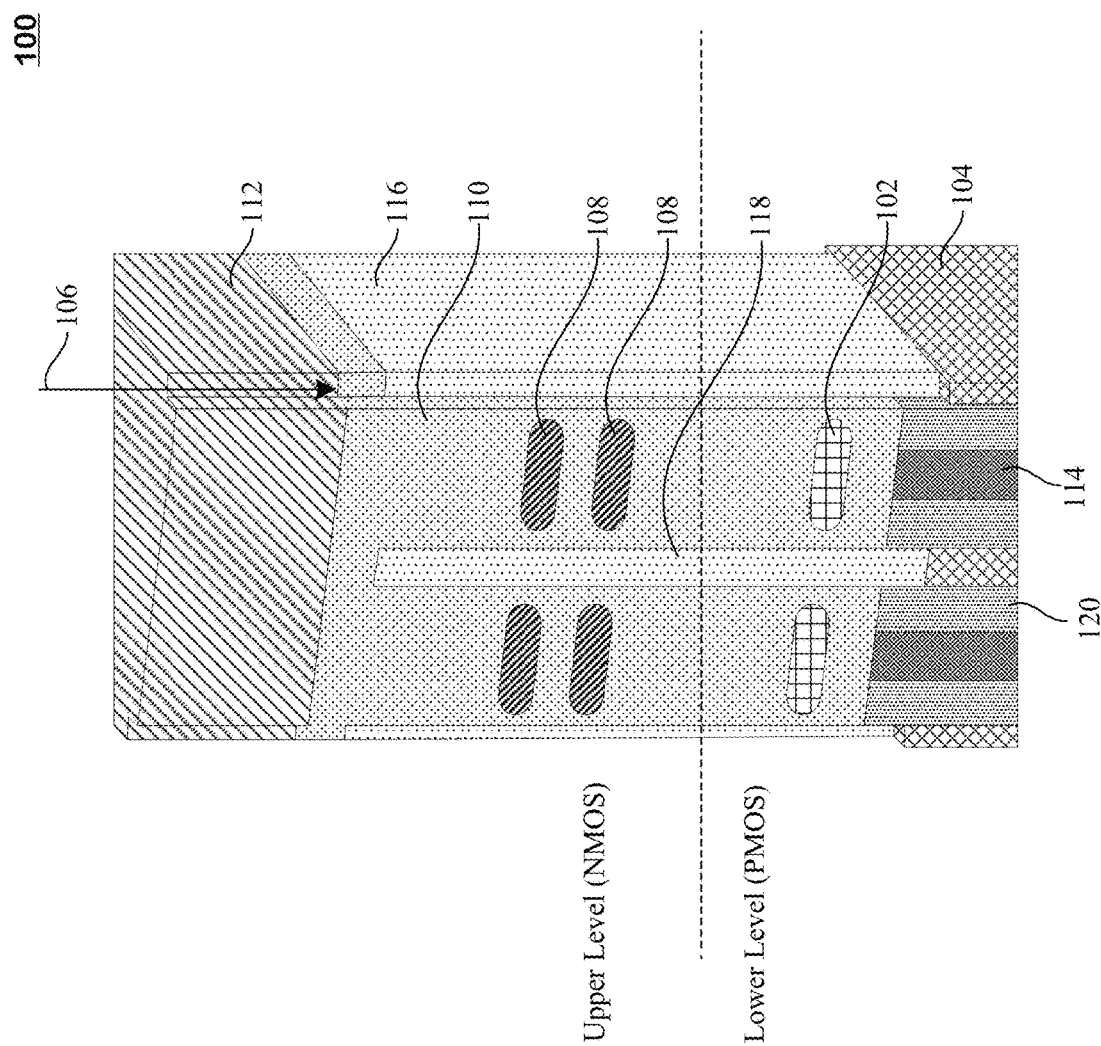
FIG. 1 illustrates a complementary field effect transistor (CFET) structure having an upper level (negative-channel metal oxide semiconductor (NMOS)) and a lower level (positive-channel metal oxide semiconductor (PMOS)) and having a contact hole that is etched to provide access to a buried power rail (BPR).

FIG. 1 illustrates a complementary field effect transistor (CFET) structure having an upper level (negative-channel metal oxide semiconductor (NMOS)) and a lower level (positive-channel metal oxide semiconductor (PMOS)) and having a contact hole that is etched to provide access to a buried power rail (BPR).

Specifically, FIG. 1 illustrates a CFET structure 100 in which great precision is required to make an electrical connection between a lower level epitaxial growth 102 and the BPR 104 using an etched contact hole 106. Even with great precision, the electrical connection using the etched contact hole 106 will have high resistance due to, for example, small contact points. For example, in order to connect the lower level epitaxial growth 102 to the BPR 104, a blocking material 110 will need to be etched away vertically. Specifically, a small portion of the blocking material 110 (near the lower level epitaxial growth 102) will need to be removed to expose the lower level epitaxial growth 102 to the etched contact hole 106, without exposing the upper level epitaxial growth 108 to the etched contact hole 106 to prevent an electrical short.

As mentioned above, the CFET structure 100 illustrated in FIG. 1 includes the contact hole 106, which is a vertical channel etched in the CFET structure 100. FIG. 1 further illustrates that the CFET structure 100 includes source and drain epitaxy at two levels (e.g., an upper level and a lower level), both levels being above the BPR 104 of the CFET structure 100. As mentioned above, the upper level of the CFET structure 100 can be an NMOS and the lower level of the CFET structure 100 can be a PMOS. Alternatively, the upper level can be PMOS and the lower level can be an NMOS. Specifically, the upper level can include an upper level epitaxial growth 108 that can be an n+ source and drain epitaxy (e.g., n+ doped silicon). The lower level can include the lower level epitaxial growth 102 that can be a p+ source and drain epitaxy (e.g., n+ SiGe).

The CFET structure 100 can also include the blocking material 110 that insulates the lower level epitaxial growth 102 from the upper level epitaxial growth 108. The blocking material 110 can include at least one of a carbon-based material, an oxide (e.g., aluminum oxide), silicon nitride-base materials, and carbon-doped silicon oxide SiCOH. The CFET structure 100 can also include a hard mask 112 above the upper level for lithographical patterning of contact hole 106 and a silicon substrate 114 below the lower level as the basis for epitaxial growth of PMOS and complementary metal oxide semiconductor (CMOS) channels. The CFET structure 100 further includes silicon nitride ($Si_3N_4$) or silicon oxynitride (SiON) 116 that is used to form, for example, a divider 118 between the sources and the drains of the upper and lower levels and can also include isolation oxide 120.

As illustrated in FIG. 1, one technique for connecting the source and/or drain epitaxial growth of the lower level of the CFET is to form (etch) the vertical contact hole 106 to allow for contact to eventually be made between the BPR 104 and the source and/or drain lower level epitaxial growth 102. The CFET structure 100 can be many layers deep (e.g., 15 or more) and solving the problem of achieving a good low resistance electrical contact between the BPR 104 and the source and/or drain lower level epitaxial growth 102 becomes more complex as the number of layers in the CFET structure 100 increases.

Figure 2:
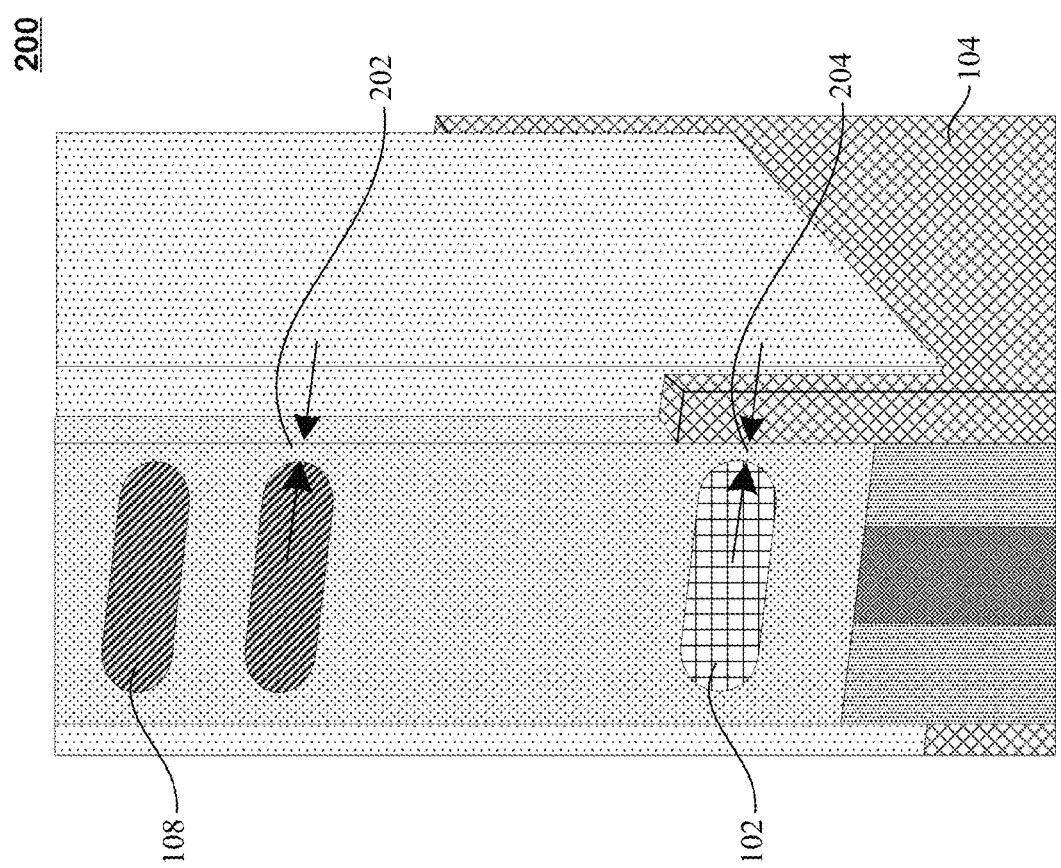
FIG. 2 illustrates the need and difficulty in making an electrical contact between the BPR and a source and/or a drain of an epitaxial growth of a lower level of the CFET.

FIG. 2 illustrates the need and difficulty in making an electrical contact between the BPR and a source and/or a drain of an epitaxial growth of a lower level of the CFET.

As illustrated in FIG. 2, making an electrical contact after the upper level epitaxial growth 108 is formed leaves no margin for error, because the contact size is constrained by the location of the upper level epitaxial growth 108. For example, it is desirable to make the contact hole 106 wide enough to provide a connection between the BPR 104 and the source and/or drain lower level epitaxial growth 102. However, the wider the contact hole 106, the closer the source and/or drain upper level epitaxial growth 108 comes to being exposed to the contact hole 106 or other materials of the CFET structure 200 (see, reference elements 202 and 204 which illustrate the fact that it is difficult to connect the source and/or drain lower level epitaxial growth 102 to the BPR 104 without exposing the source and/or drain upper level epitaxial growth 108 to the BPR 104 or other portions of the CFET structure 200).

Specifically, as illustrated, it is difficult to form a good low resistance connection between the BPR 104 and the lower level epitaxial growth 102 because the point of contact 204 between the BPR 104 and the lower level epitaxial growth 102 will be very small. In other words, making an electrical connection between the source and/or drain lower level epitaxial growth 102 and the BPR 104 without exposing or connecting the source and/or drain upper level epitaxial growth 108 to (i) the BPR 104 or (ii) the lower level epitaxial growth 102 requires a high precision process. Furthermore, even if this can be achieved, the connection between the BPR 104 and the source and/or drain lower level epitaxial growth 102 will not be very good, as there will be a small point of contact (e.g., contact area of about 1 nm by 1 nm) and the resistance will be undesirably high (e.g., tens of kilo ohms).

Figure 3A:
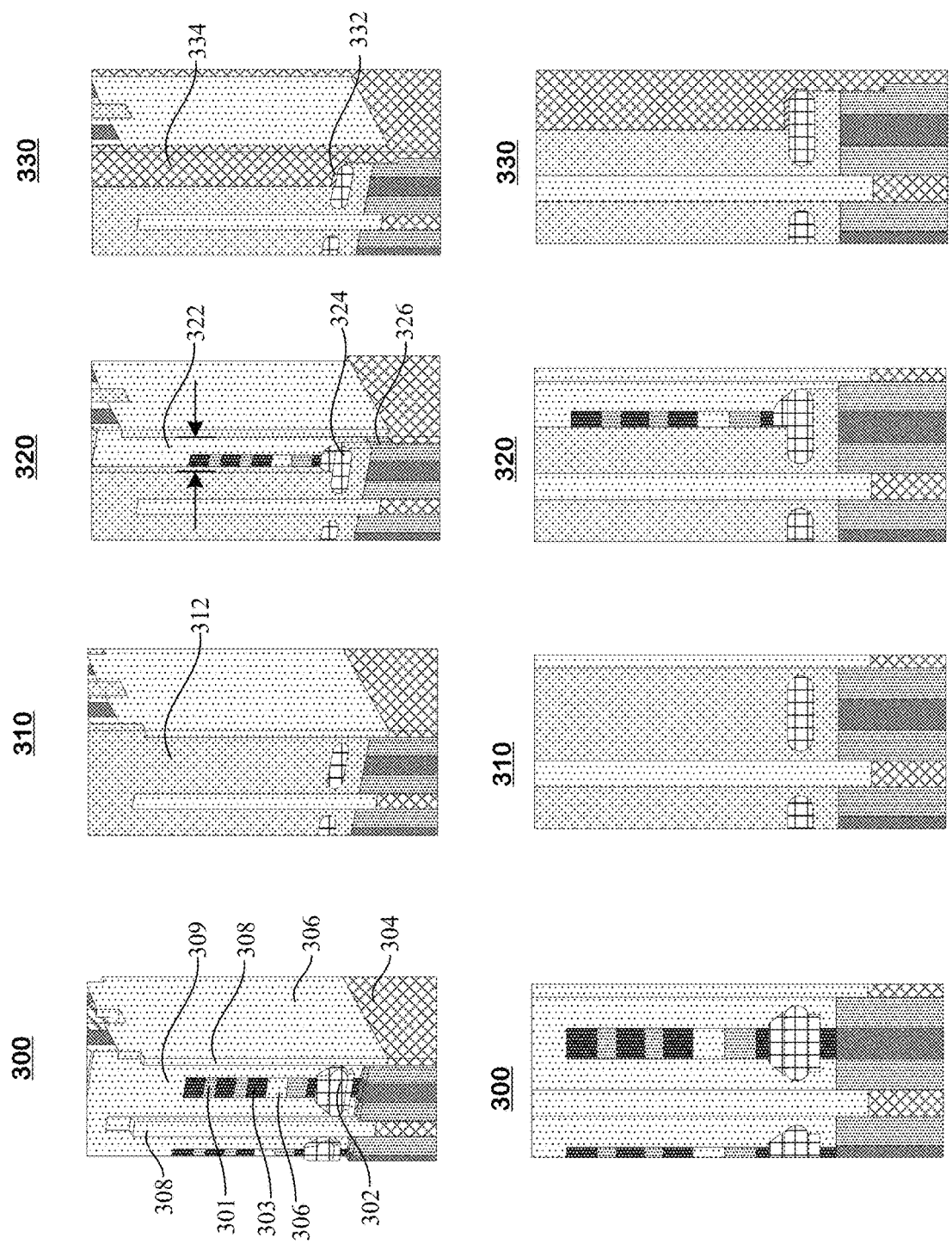
FIGS. 3A and 3B provide both three-dimensional (top row) and two-dimensional side-view (bottom row) illustrations of operations performed to form an electrical contact between the BPR and the source and/or drain lower level epitaxial growth of the CFET structure.
Figure 3B:
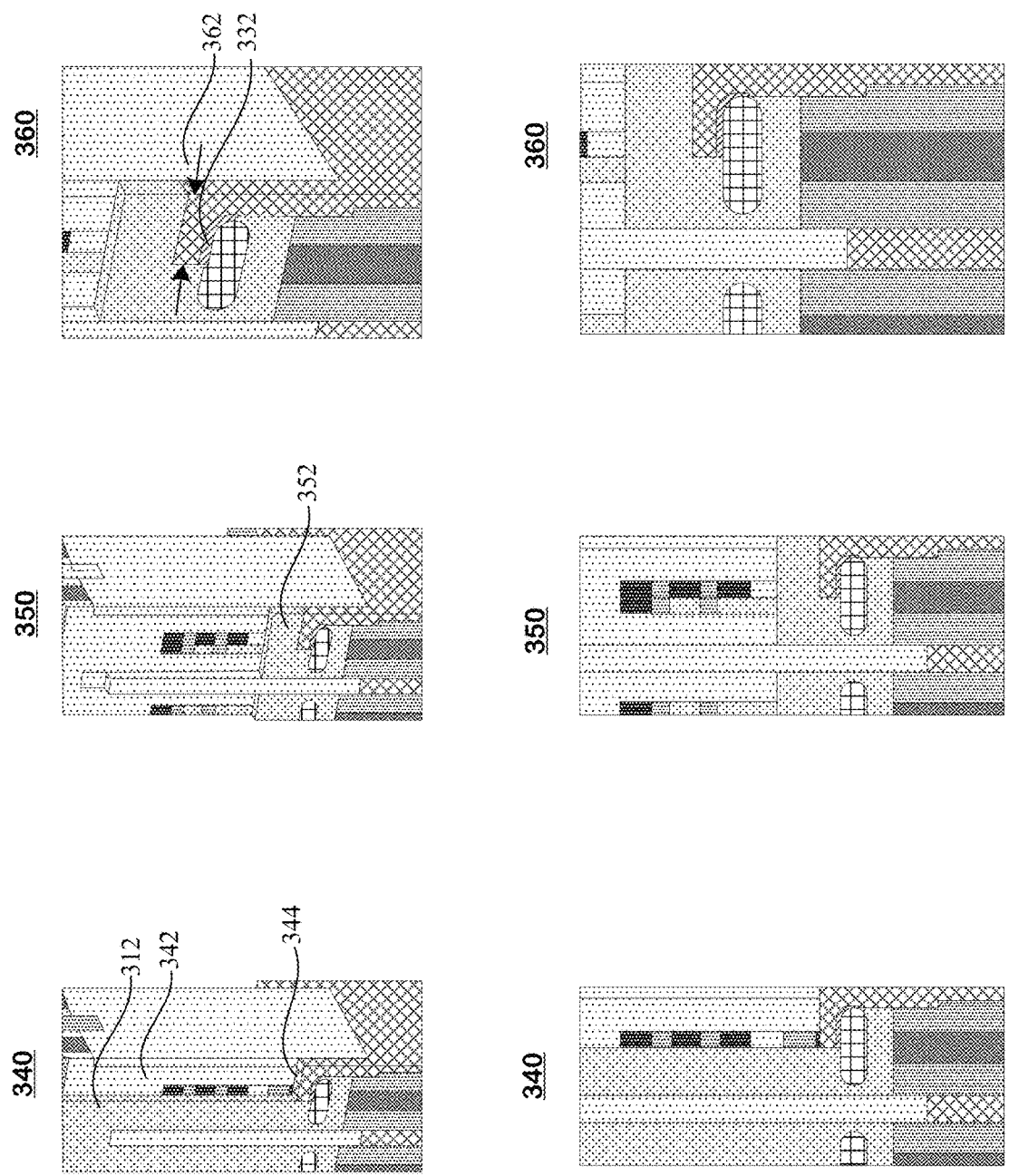

FIGS. 3A and 3B provide both three-dimensional (top row) and two-dimensional side-view (bottom row) illustrations of operations performed to form an electrical contact between the BPR and the source and/or drain lower level epitaxial growth of the CFET structure.

The technology disclosed includes: (i) performing contact formation after the source and drain lower level epitaxy process is complete; (ii) etching a wide vertical channel down to the source and/or drain lower level S/D epitaxy; and (iii) filling in contact metal after formation of a contact material (metal silicide) at an exposed portion of the source and/or drain lower level epitaxy and then etching back a portion of the contact metal.

Specifically, the process includes operation 300 of obtaining an unfinished CFET structure, which includes, a BPR 304 and nitride 306 that is used to form, for example, vertical dividers 308 that can be between the sources and the drains of the upper and lower levels. Further, the unfinished CFET structure includes a vertical slot 309 formed between the vertical dividers 308. Operation 300 further includes performing silicon epitaxial growth 302 in the lower level of the unfinished.

The process further includes operation 310 of adding a blocking material 312 to fill at least a portion of the vertical slot 309 of the unfinished CFET. The blocking material 312 can cover some or all exposed surfaces (e.g., the protective surface oxide of silicon nanosheets 301 and inner dielectric spacer 303 of the upper level NMOS) that were located in the vertical slot 309 (e.g., compare exposed surfaces in the vertical slot 309 illustrated in operation 300 that are now covered in operation 310). The silicon epitaxial growth 302 is also covered by the blocking material 312. The blocking material can be at least one of a carbon-base material, aluminum oxide, silicon nitride-based materials and carbon deposed silicon oxide (SiCOH).

The process also includes operation 320 of performing a contact etch on the blocking material 312 to form a vertical channel 322 that exposes a portion 324 of the silicon epitaxial growth 302 in the lower level. The arrows in operation 320 illustrate the width of the vertical channel 322. As illustrated the vertical channel 322 is wide enough to expose top and side portions 324 of the silicon epitaxial growth 302 that were previously covered by the blocking material 312. Note that it is not necessary to expose both top and side portions 324 of the silicon epitaxial growth 302 (e.g., only a top portion may be exposed or only a side portion may be exposed). Alternatively, a bottom portion of the silicon epitaxial growth 302 can be exposed by an isotropic etch. The contact etching can also remove a portion of isolation oxide 326 and can expose the BPR 304. Accordingly, the vertical channel 322 provides an open space between the top and side portions 324 of the silicon epitaxial growth 302 and the BPR 304.

The process further includes operation 330 of adding a contact material 332, such as Ti or titanium silicide, to at least a portion of the exposed top and side portion 324 of the source and/or drain lower level epitaxial growth 302. Operation 330 also includes adding a conductive material 334 within the vertical channel 322, such that the conductive material 334 is in contact with the contact material 332 and the BPR 304 to form an electrical connection between the top and side portions 324 of the silicon epitaxial growth 302 and the BPR 304. This contact material 332 and the conductive material 334 form the wrap-around contact with the silicon epitaxial growth 302. The operation of adding the contact material 332 can be omitted and the conductive material 334 can be added without the use of the contact material 332. The conductive material 334 can be comprised of, at least one of, Ruthenium, Tungsten, Cobalt, Molybdenum, etc. This operation 330 can include completely filling the vertical channel 322 with the conductive material 334 or partially filling in at least a portion of the vertical channel 322 with the conductive material 334 so that the exposed portion 324 is covered by the conductive material 334.

The process also includes operation 340 of etching back a portion of the conductive material 334 to a desired height 344 above the silicon epitaxial growth 302, leaving a channel 342 above the remaining portion of the conductive material 334. This operation 340 can also include removing some or all of the blocking material 312.

The process further includes operation 350 of adding additional blocking material 352 to cover (some or all of) the etched back conductive material 334 above the source and/or drain lower level epitaxial growth 302, so as to provide insulation around the source and/or drain lower level epitaxial growth 302 and to allow for upper level epitaxy.

Reference element 360 illustrates the connection between the top and/or side portion 324 of the silicon epitaxial growth 302, the contact material 332 and the conductive material 334 connected to the BPR 304. Specifically, reference element 360 illustrates the width 362 of the connection between the silicon epitaxial growth 302 and the conductive material 334 that connects to the BPR 304. Additionally, as mentioned above, after this wrap-around connection is performed, silicon epitaxial growth can be formed in an upper level of the unfinished CFET structure. The upper level can form a negative-channel metal oxide semiconductor. Further, the silicon epitaxial growth performed on the upper level can be SiGe epitaxial growth. Additionally, the silicon epitaxial growth on the upper level can be n+ source and/or drain epitaxy to form n+ doped silicon. These above-described operations can provide a robust process and yield excellent low-level contact resistance between the silicon epitaxial growth 302 and the BPR 304.

Figure 4:
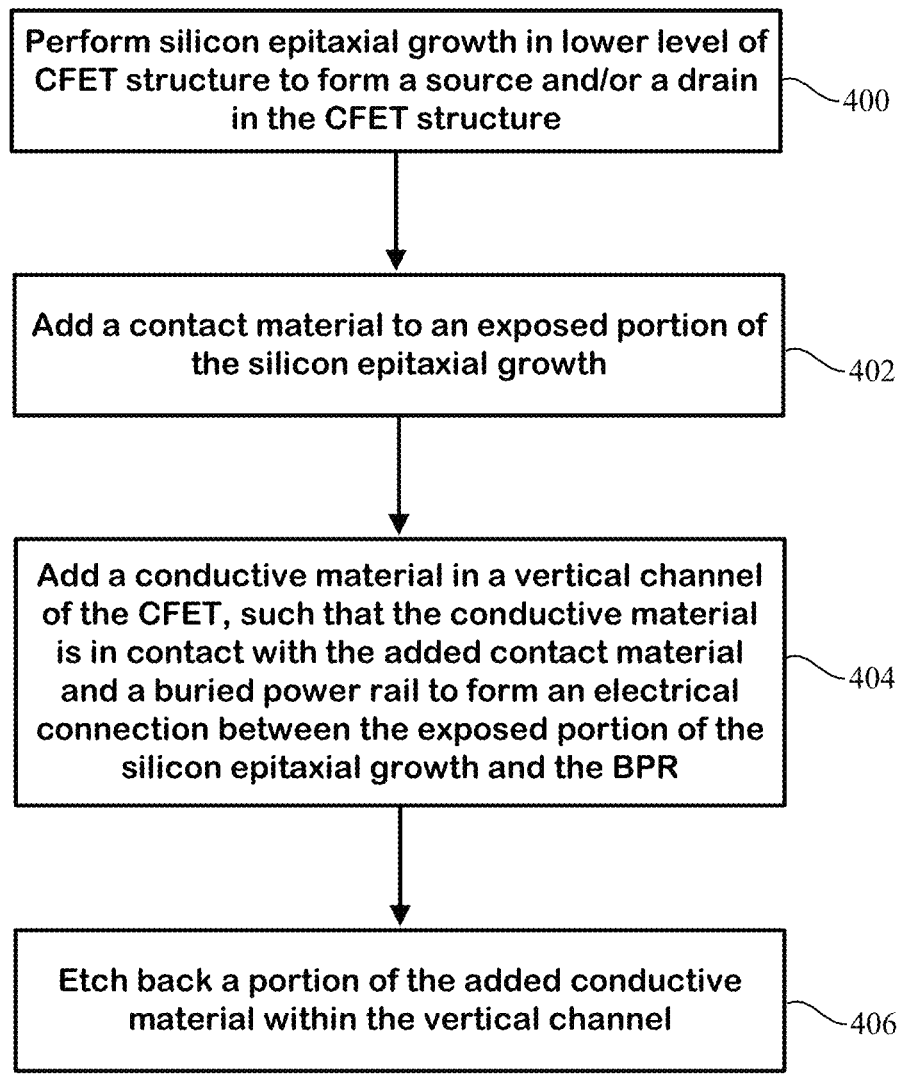
FIG. 4 illustrates a flowchart describing the operations performed to form an electrical contact between the BPR and the source and/or drain lower level epitaxial growth of the CFET structure.

FIG. 4 illustrates a flowchart describing the operations performed to form an electrical contact between the BPR and the source and/or drain lower level epitaxial growth of the CFET structure.

Specifically, FIG. 4 illustrates operations for forming an electrical connection between a BPR of a CFET and a source or drain epitaxial growth of a lower level of the unfinished CFET. The operations can include an operation 400 of performing silicon epitaxial growth in a lower level of an unfinished CFET structure to form at least one of a source and a drain in the lower level of the unfinished CFET structure. The operations can include an operation 402 of adding a contact material to at least a portion of an exposed portion of the silicon epitaxial growth in the lower level, the exposed portion of the silicon epitaxial growth being located in a vertical slot of the unfinished CFET structure. Further, the operations can include an operation 404 of adding a conductive material within a vertical channel formed in the unfinished CFET structure, the conductive material being in contact with (i) the contact material added to the portion of the exposed portion of the silicon epitaxial growth in the lower level and (ii) the BPR to form an electrical connection between the portion of the exposed portion of the silicon epitaxial growth and the BPR. Additionally, the operations can include an operation 406 of etching back a portion of the added conductive material within the vertical channel.

Figure 5:
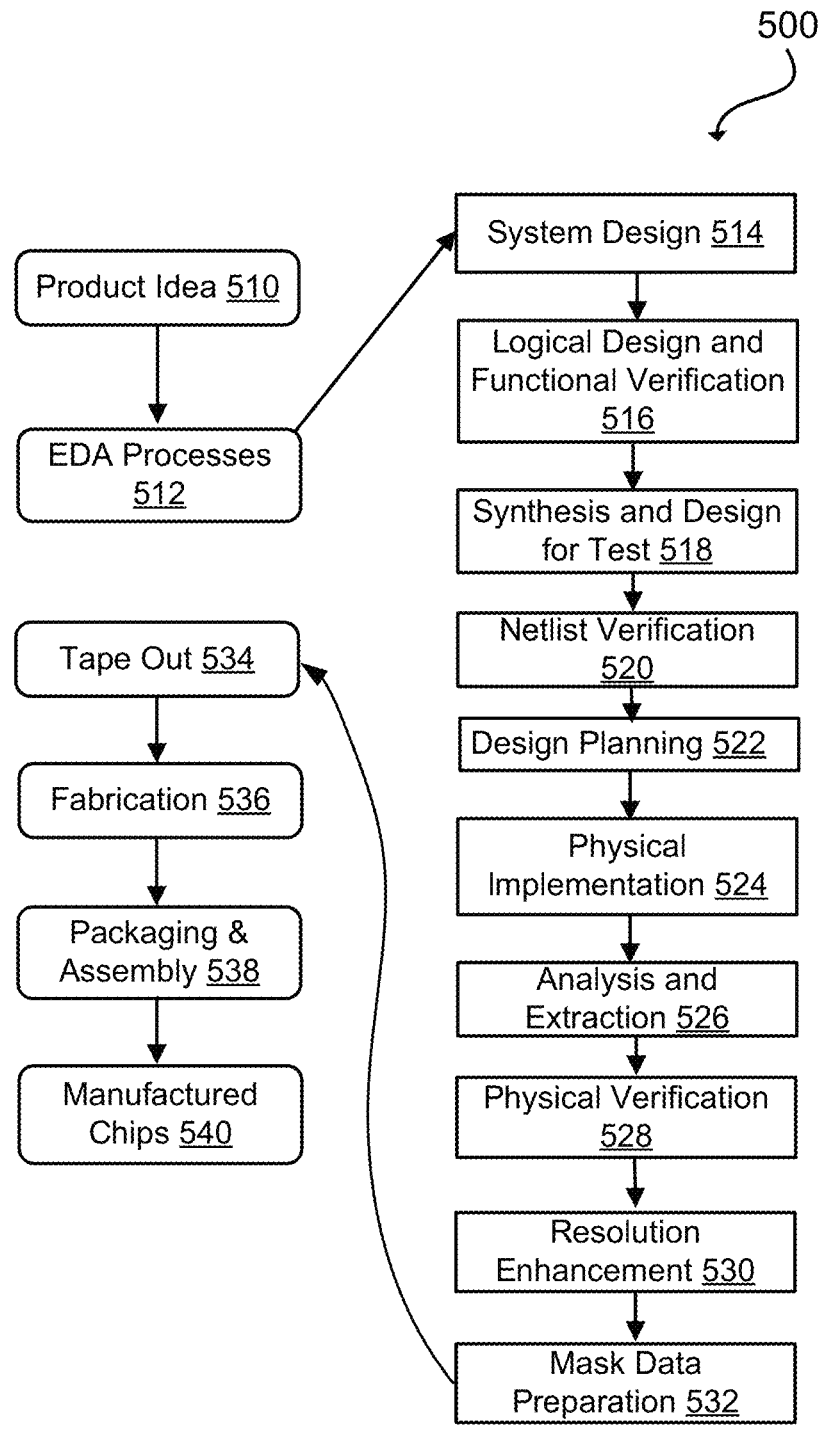
FIG. 5 depicts a flowchart of various processes used during the design and manufacture of an integrated circuit in accordance with some embodiments of the present disclosure.

FIG. 5 illustrates an example set of processes 500 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 510 with information supplied by a designer, information which is transformed to create an article of manufacture that uses a set of EDA processes 512. When the design is finalized, the design is taped-out 534, which is when artwork (e.g., geometric patterns) for the integrated circuit is sent to a fabrication facility to manufacture the mask set, which is then used to manufacture the integrated circuit. After tape-out, a semiconductor die is fabricated 536 (using the techniques of the technology disclosed, as discussed above) and packaging and assembly processes 538 are performed to produce the finished integrated circuit 540. The above-described forming of the wrap-around contact(s) can be performed in this fabrication stage 536.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 5. The processes described by be enabled by EDA products (or tools).

During system design 514, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 518, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 520, the netlist is checked for compliance with timing constraints and for correspondence with the HDL code. During design planning 522, an overall floor plan for the integrated circuit is constructed and analyzed for timing and top-level routing.

During layout or physical implementation 524, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 526, the circuit function is verified at the layout level, which permits refinement of the layout design. During physical verification 528, the layout design is checked to ensure that manufacturing constraints are correct, such as DRC constraints, electrical constraints, lithographic constraints, and that circuitry function matches the HDL design specification. During resolution enhancement 530, the geometry of the layout is transformed to improve how the circuit design is manufactured.

During tape-out, data is created to be used (after lithographic enhancements are applied if appropriate) for production of lithography masks. During mask data preparation 532, the 'tape-out' data is used to produce lithography masks that are used to produce finished integrated circuits.

A storage subsystem of a computer system (such as computer system 500 of FIG. 5) may be used to store the programs and data structures that are used by some or all of the EDA products described herein, and products used for development of cells for the library and for physical and logical design that use the library.

Figure 6:
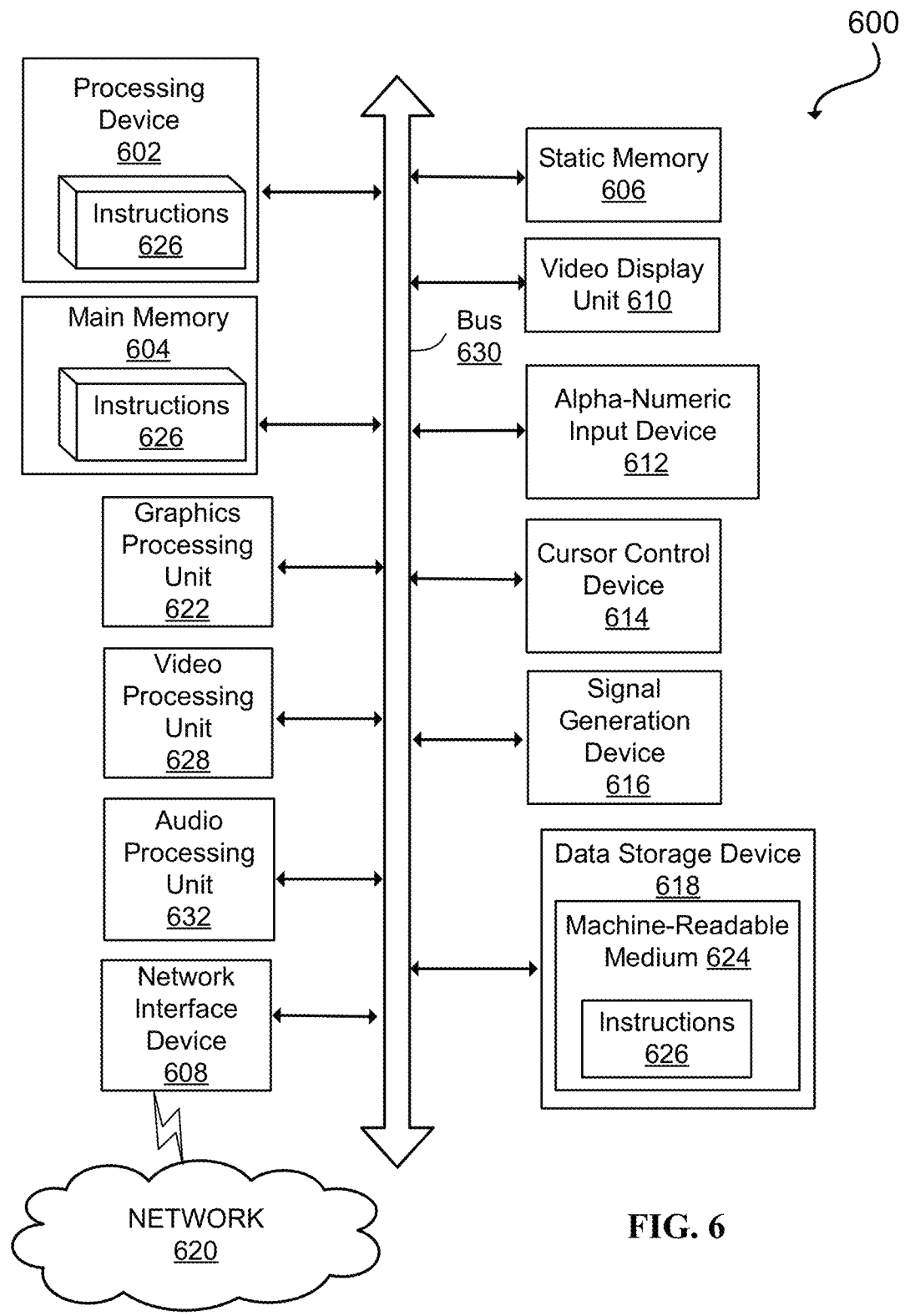
FIG. 6 depicts an abstract diagram of an example computer system in which embodiments of the present disclosure may operate.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630.

Processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

We claim as follows:

1. A method of forming an electrical connection, the method comprising:
    performing silicon epitaxial growth in a lower level of a complementary field effect transistor (CFET) structure to form at least one of a source and a drain in the lower level of the CFET structure;
    forming two vertical dividers to create a vertical slot therebetween, wherein the two vertical dividers are adjacent to the at least one of the source and the drain;
    adding a contact material to at least a portion of an exposed portion of the silicon epitaxial growth in the lower level, the exposed portion of the silicon epitaxial growth being located in the vertical slot of the CFET structure;
    adding a conductive material within a vertical channel formed in the CFET structure, the conductive material being in contact with (i) the contact material added to the portion of the exposed portion of the silicon epitaxial growth in the lower level and (ii) a buried power rail (BPR) to form an electrical connection between the portion of the exposed portion of the silicon epitaxial growth and the BPR; and
    etching back a portion of the added conductive material within the vertical channel,
    wherein, during the adding of the contact material, an unexposed portion of the silicon epitaxial growth is located in the vertical slot and is covered by a blocking material, such that the contact material is only added to the exposed portion of the silicon epitaxial growth.

2. The method of claim 1, wherein the lower level forms a positive-channel metal oxide semiconductor.

3. The method of claim 1, wherein the silicon epitaxial growth performed on the lower level is SiGe epitaxial growth.

4. The method of claim 3, wherein the silicon epitaxial growth performed on the lower level is p+ source and drain epitaxy to form n+ SiGe.

5. The method of claim 1, wherein the contact material is one or more of Ti and Ti silicide.

6. The method of claim 1, further comprising, prior to the adding of the contact material to at least the portion of the exposed portion of the silicon epitaxial growth in the lower level:
adding the blocking material to fill at least a portion of the vertical slot of the CFET structure; and
performing a contact etch on the added blocking material to form the vertical channel that exposes the portion of the silicon epitaxial growth in the lower level that was previously covered by the blocking material.

7. The method of claim 6, wherein, before the performing of the contact etch, the blocking material covers all exposed surfaces within the vertical slot, except for a contact surface of the silicon epitaxial growth.

8. The method of claim 6, wherein the blocking material includes at least one or more of a carbon-based material, aluminum oxide, silicon nitride-based materials, and cesium hydroxide.

9. The method of claim 6, wherein the conductive material is added by filling in at least a portion of the vertical channel, such that the conductive material (i) covers the contact material, (ii) reaches the BPR and (iii) forms the electrical connection between the portion of the exposed portion of the silicon epitaxial growth and the BPR.

10. The method of claim 9, wherein the conductive material includes at least one or more of Ruthenium, Tungsten, Cobalt and Molybdenum.

11. The method of claim 6, further comprising, after the etching-back of the portion of the added conductive material, adding the blocking material within the vertical channel to cover at least a portion of the etched-back conductive material.

12. The method of claim 1, further comprising, adding the blocking material within the vertical channel to cover at least a portion of the etched-back conductive material.

13. The method of claim 12, wherein the blocking material includes at least one of a carbon-based material, aluminum oxide, silicon nitride-based materials, and carbon doped silicon oxide (SiCOH).

14. The method of claim 1, further comprising performing silicon epitaxial growth in an upper level of an CFET structure.

15. The method of claim 14, wherein the upper level forms a negative-channel metal oxide semiconductor.

16. The method of claim 14, wherein the silicon epitaxial growth performed on the upper level is Si epitaxial growth on Si.

17. The method of claim 16, wherein the silicon epitaxial growth on the upper level is n+S/D epitaxy to form n+ doped silicon.

18. A system for forming an electrical connection, the system comprising:
a memory storing instructions; and
a processor, coupled with the memory and to execute the instructions, the instructions when executed causing the processor to:
perform silicon epitaxial growth in a lower level of a complementary field effect transistor (CFET) structure to form at least one of a source and a drain in the lower level of the CFET structure;
form two vertical dividers to create a vertical slot therebetween, wherein the two vertical dividers are adjacent to the at least one of the source and the drain;
add a contact material to at least a portion of an exposed portion of the silicon epitaxial growth in the lower level, the exposed portion of the silicon epitaxial growth being located in the vertical slot of the CFET structure;
add a conductive material within a vertical channel formed in the CFET structure, the conductive material being in contact with (i) the contact material added to the portion of the exposed portion of the silicon epitaxial growth in the lower level and (ii) a buried power rail (BPR) to form an electrical connection between the portion of the exposed portion of the silicon epitaxial growth and the BPR; and
etch back a portion of the added conductive material within the vertical channel,
wherein, during the adding of the contact material, an unexposed portion of the silicon epitaxial growth is located in the vertical slot and is covered by a blocking material, such that the contact material is only added to the exposed portion of the silicon epitaxial growth.

19. A non-transitory computer readable storage medium comprising stored instructions for forming an electrical connection, the instructions, when executed by a processor, causing the processor to implement operations including:
performing silicon epitaxial growth in a lower level of a complementary field effect transistor (CFET) structure to form at least one of a source and a drain in the lower level of the CFET structure;
forming two vertical dividers to create a vertical slot therebetween, wherein the two vertical dividers are adjacent to the at least one of the source and the drain;
adding a contact material to at least a portion of an exposed portion of the silicon epitaxial growth in the lower level, the exposed portion of the silicon epitaxial growth being located in the vertical slot of the CFET structure;
adding a conductive material within a vertical channel formed in the CFET structure, the conductive material being in contact with (i) the contact material added to the portion of the exposed portion of the silicon epitaxial growth in the lower level and (ii) a buried power rail (BPR) to form an electrical connection between the portion of the exposed portion of the silicon epitaxial growth and the BPR; and
etching back a portion of the added conductive material within the vertical channel,
wherein, during the adding of the contact material, an unexposed portion of the silicon epitaxial growth is located in the vertical slot and is covered by a blocking material, such that the contact material is only added to the exposed portion of the silicon epitaxial growth.

* * * * *